United States Patent [19]

Asai et al.

[11] Patent Number: 5,210,800
[45] Date of Patent: May 11, 1993

[54] OPTICAL SENSOR AND METHOD FOR PRODUCING THE SAME

[75] Inventors: Yuji Asai, Chita; Masanobu Yamamoto, Handa, both of Japan

[73] Assignee: NGK Insulators, Ltd., Japan

[21] Appl. No.: 852,646

[22] Filed: Mar. 17, 1992

[30] Foreign Application Priority Data

Mar. 20, 1991 [JP] Japan .................. 3-080636

[51] Int. Cl.[5] .............................. G02B 6/12
[52] U.S. Cl. ........................ 385/12; 385/14; 359/900
[58] Field of Search ............. 385/12, 14, 88, 147; 359/900; 250/227.11, 227.24

[56] References Cited

U.S. PATENT DOCUMENTS

| 4,249,076 | 2/1981 | Bergstrom et al. | 250/227.21 |
| 4,762,381 | 8/1988 | Uemiya et al. | 385/88 |
| 4,962,990 | 10/1990 | Matsuzawa et al. | 385/34 |

FOREIGN PATENT DOCUMENTS

| 0084120 | 7/1983 | European Pat. Off. . |
| 0467620 | 1/1992 | European Pat. Off. . |
| 62-198775 | 2/1987 | Japan . |
| 62-091810 | 4/1987 | Japan . |
| 62-54170 | 9/1987 | Japan . |

Primary Examiner—Frank Gonzalez
Assistant Examiner—John Ngo
Attorney, Agent, or Firm—Parkhurst, Wendel & Rossi

[57] ABSTRACT

An optical sensor including a plurality of optical elements such as lenses, a polarizer, and analyzer, optical fibers, and a Pockels element or Faraday element. Light from a light source is transmitted through the optical elements of the optical sensor to optically measure applied voltage or an electric field acting upon the Pockels Faraday element on the basis modulation of the light received by a light receiver. The optical sensor includes a first synthetic resin interposed between adjacent optical elements in close contact with the optical elements without gaps, and a second synthetic resin of the same material as the first synthetic resin filled around the optical elements. The optical elements may be bonded to a base plate for adjusting optical axes of the optical elements, and the second synthetic resin may be filled around the optical elements and the base plate.

15 Claims, 6 Drawing Sheets

FIG_1
PRIOR ART
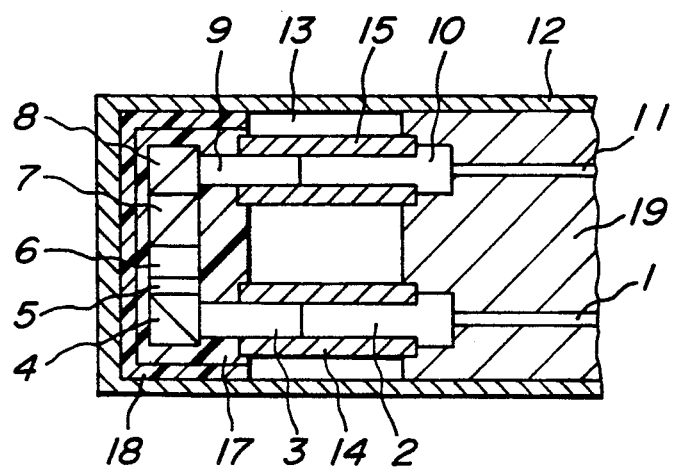
FIG_2
PRIOR ART
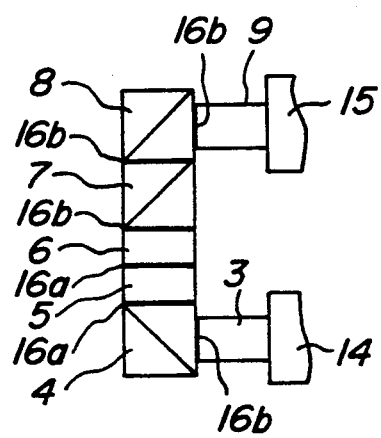

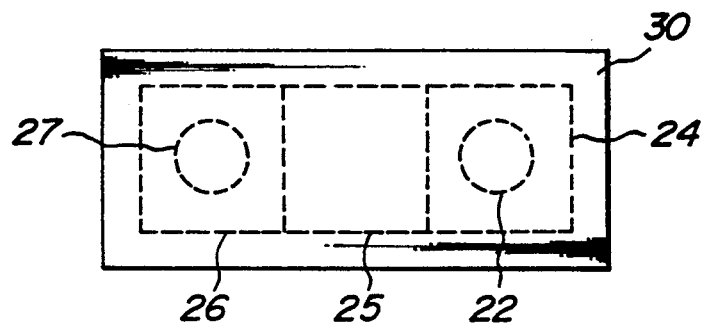
FIG_3
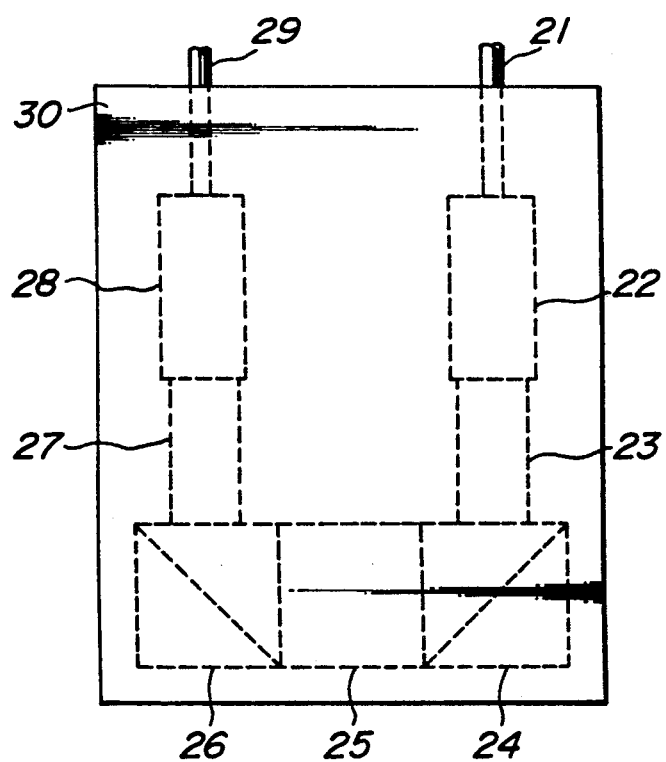
FIG_4
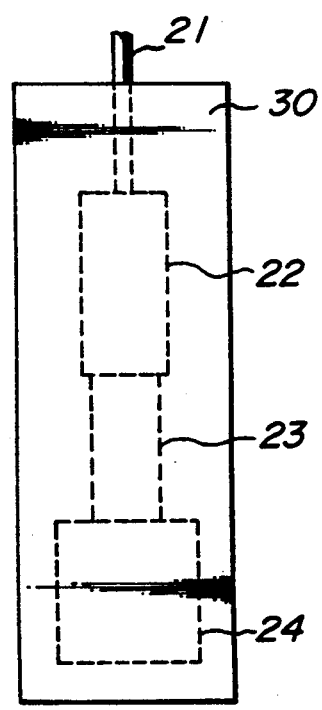
FIG_5

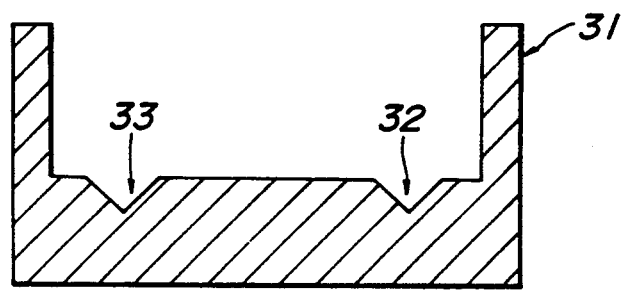
FIG_6
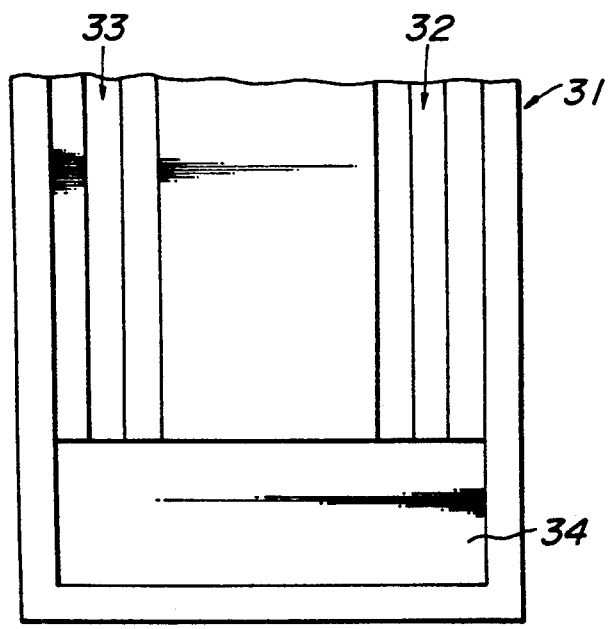
FIG_7
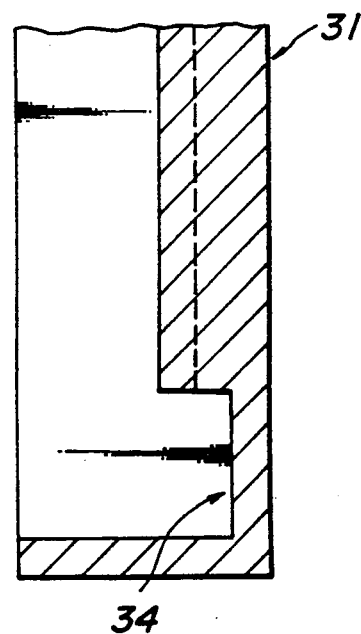
FIG_8

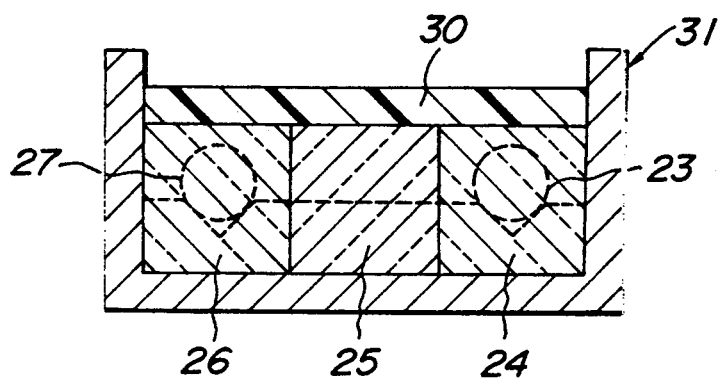
FIG_9
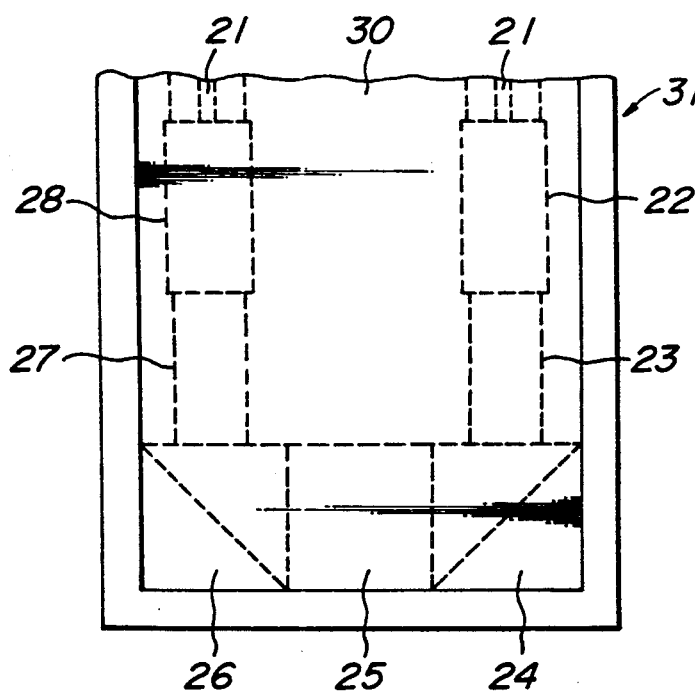
FIG_10
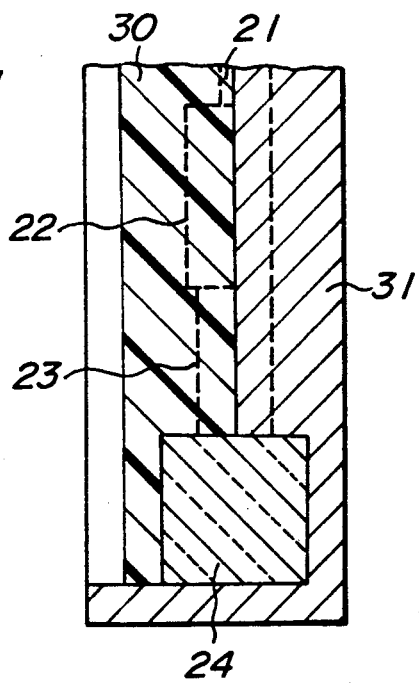
FIG_11

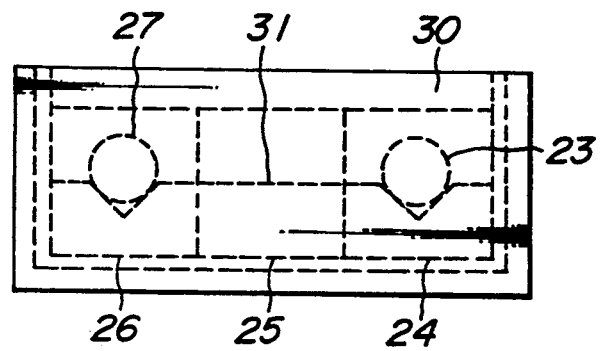
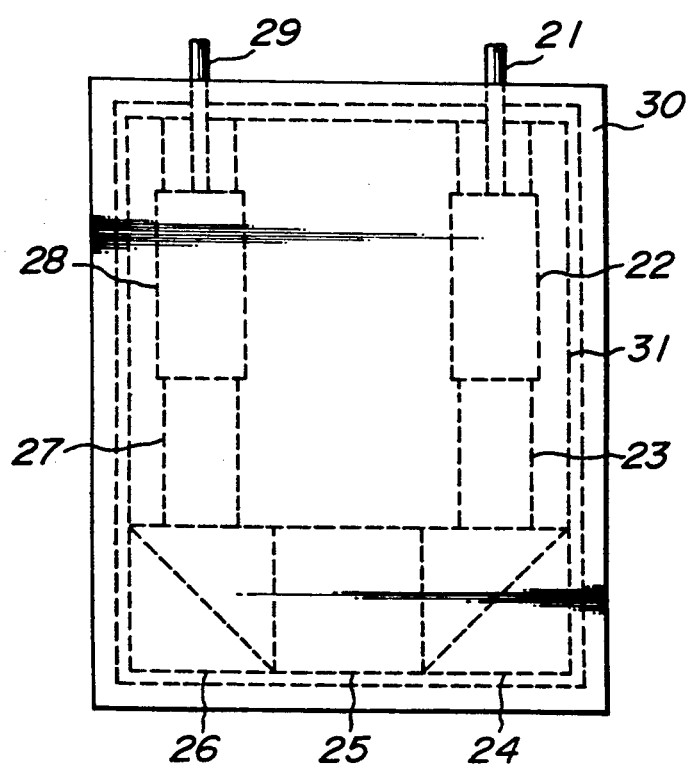
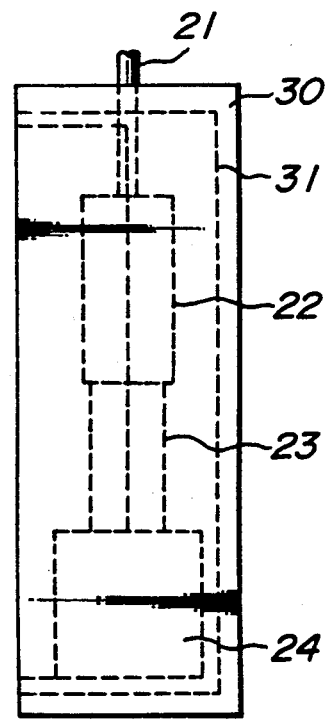

OPTICAL SENSOR AND METHOD FOR PRODUCING THE SAME

BACKGROUND OF THE INVENTION

This invention relates to a optical sensor for detecting fault points and fault sections, for example, at electric power transmission lines, distribution lines and transformer substations and the like, and a method for producing the optical sensor.

Optical sensors have been known, for example, as disclosed in Japanese Patent Application Laid-open No. 62-54,170. As shown in FIG. 1, the disclosed known optical voltage sensor includes an optical fiber core 1, a plug 2, a microlens 3, a polarizer 4, a Pockels element 5, a quarter-wave plate 6, an analyzer 7, a reflecting mirror 8, a microlens 9, a plug 10 and an optical fiber core 11. A light source (not shown) generates light which passes through optical elements 1-11 of the sensor, which light is received by a light receiver (not shown). The voltage applied to the Pockels element 5 is optically measured from the modulation of the light received by the light receiver.

In the optical voltage sensor shown in FIG. 1, the respective optical elements 1-11 are accommodated in a package 12 having therein a holder 13. The holder 13 is provided with a pipe 14 for holding the plug 2 and the microlens 3 on the input side and with a pipe 15 for holding the microlens 9 and the plug 10 on the output side.

In order to prevent the moisture from entering the optical passages and to stabilize the detector against vibrations due to drop shock, the microlens 3, the polarizer 4, the Pockels element 5, the quarter-wave plate 6, the analyzer 7, the reflecting mirror 8, and the microlens 9 are joined to one another by means of a flexible adhesive 16a at boundaries on both sides of the Pockels element 5 and by means of a rigid adhesive 16b at remaining boundaries as shown in FIG. 2. Moreover, in order to unite these elements and the package 12, and more improve the resistance to the moisture and the vibrations due to drop shock, the respective optical elements are coated therearound with a flexible resin 17 and embedded in a rigid resin 18 by potting. Moreover, the package 12 is filled with Kevlar fibers 19 on the side of the optical cores 1 and 11 with respect to the holder 13.

In the conventional optical voltage sensor described above, however, since the respective optical elements are bonded with each other by means of the adhesives 16a and 16b, residual stresses occur in the boundaries between them due to shrinkage of the adhesives when solidifying. Therefore, the optical elements may often be shifted from each other owing to change in external temperature, thereby increasing light loss and causing changes in modulation. As a result, temperature characteristics of the instrument are detrimentally affected.

Moreover, since the respective optical elements are coated with the flexible resin 17 and further embedded in the rigid resin 18 by potting, cracks may occur in the boundaries between the optical elements owing to thermal stresses caused by temperature changes due to difference between coefficients of thermal expansion of the flexible and rigid resins 17 and 18. Further, cracks may occur in the flexible and rigid resins 17 and 18. As a result, the optical elements may become susceptible to moisture and vibration due to drop shock.

With the optical voltage sensor described above, moreover, all the optical elements are accommodated in the package 12 having the holder 13 which holds the plug 2 and the microlens 3 by the pipe 14 on the input side and the microlens 9 and the plug 10 by the pipe 15 on the output side. Therefore, the number of parts is unavoidably high, and the holder 13 and the package 12 fitted together must be produced with high accuracy. Accordingly, the instrument itself is expensive and the process for producing the instrument is complicated, thus lowering mass-productivity.

SUMMARY OF THE INVENTION

It is a primary object of the invention to provide an improved optical sensor which eliminates the aforementioned disadvantages of the prior art and which is properly constructed to obtain good temperature characteristics and superior resistance to moisture and vibration and shock due to drop.

It is another object of the invention to provide a method of producing such an optical sensor in mass-production with low cost.

In order to accomplish the first object of the invention, in an optical sensor including a plurality of optical elements such as at least a lens, polarizer, Pockels element or Faraday element, analyzer and optical fiber cores for transmitting light, the optical sensor according to the invention comprises a first synthetic resin interposed between said optical elements to be in close contact with the optical elements without a clearance, and a second synthetic resin filled around the optical elements, the second synthetic resin being of the same material as the first synthetic resin.

In another aspect, the optical sensor according to the invention further comprises a base plate for arranging the optical elements thereon and adjusting optical axes of the optical elements, a first synthetic resin interposed between said optical elements to be in close contact with the optical elements without a clearance, and a second synthetic resin filled around the optical elements, the second synthetic resin being of the same material as the first synthetic resin.

In order to accomplish the second object of the invention, in a method for producing an optical sensor including a plurality of optical elements through which light beams are transmitted, the method according to the invention comprises steps of arranging the optical elements on a first base plate to adjust optical axes of the optical elements so that the optical elements are in close contact with a first synthetic resin interposed between the optical elements, filling a second synthetic resin of the same material as the first synthetic resin around the optical elements, solidifying the filled second synthetic resin, removing the optical elements together with the solidified second synthetic resin from the first base plate, turning the removed optical elements and the second synthetic resin upside down and arranging them on a second base plate having a flat bottom surface, filling a third synthetic resin of the same material as the first synthetic resin around the optical elements and solidifying the filled third synthetic resin, and removing the optical elements together with the second and third synthetic resins from the second base plate.

In another aspect of the invention, the method for producing an optical sensor comprises steps of bonding the optical elements onto a first base plate for adjusting optical axes of the optical elements so that the optical elements are in close contact with a first synthetic resin interposed between the optical elements, filling a second synthetic resin of the same material as the first synthetic resin around the optical elements, solidifying the filled second synthetic resin, turning the optical elements upside down together with the first base plate bonded therewith and the second synthetic resin and arranging them in the turned state on a second base plate having a flat bottom surface, filling a third synthetic resin of the same material as the first synthetic resin around the optical elements and the first base plate and solidifying the filled third synthetic resin, and removing the optical elements together with the first base plate and the second and third synthetic resins from the second base plate.

According to the invention the optical elements are in close contact with a first synthetic resin without any gaps therebetween, and embedded in a synthetic resin of the same material as the first synthetic resin. Therefore, it is possible to prevent thermal stresses in the sensor due to difference in thermal expansion coefficients so that temperature characteristics of the optical sensor can be effectively improved. Moreover, by the prevention of the thermal stresses, the synthetic resins in the sensor are free from cracks, crevices and damage. Accordingly, the optical sensor according to the invention has superior resistance to moisture, vibration and shocks so that the reliability of the optical sensor is improved.

In another aspect of the invention, the optical elements are in close contact with a first synthetic resin without any gaps therebetween, and embedded in a synthetic resin of the same material as the first synthetic resin together with the base plate for adjusting optical axes of the optical elements. Therefore, the same effects as described above can be obtained.

According to the method of the invention, moreover, the optical sensor can be produced by the repeatedly usable first and second base plates without requiring any package integral with a holder. Therefore, the method according to the invention can produce the optical sensor having a fewer number of parts and can produce the optical sensor inexpensively with high mass-productivity.

According to the method of the invention, furthermore, the optical sensor can be produced by using the first base plate made integral with the optical elements and the repeatedly usable second base plate. Therefore, the method according to the invention utilizes a fewer number of parts with respect to the prior art methods, is inexpensive and yields superior mass-productivity.

The invention will be more fully understood by referring to the following detailed description taken in connection with the appended drawings.

BRIEF DESCRIPTION OF THE DRAWINGS

FIG. 1 is a sectional view illustrating an optical sensor of the prior art;

FIG. 2 is a partial view illustrating in detail the principal optical elements of the optical sensor shown in FIG. 1;

FIG. 3 is a front view illustrating one embodiment of the optical sensor according to the invention;

FIG. 4 is a plan view of the optical sensor shown in FIG. 3;

FIG. 5 is a side view of the optical sensor shown in FIG. 4;

FIG. 6 is a cross-sectional front view illustrating one example of the base plate for adjusting optical axes of the optical elements to be used for producing the optical sensor shown in FIGS. 3 to 5 according to the invention;

FIG. 7 is a plan view of the base plate shown in FIG. 6;

FIG. 8 is a longitudinal-sectional side view of the base plate shown in FIG. 7;

FIG. 9 is a cross-sectional front view for explaining the method for producing the optical sensor shown in FIGS. 3 to 5 according to the invention;

FIG. 10 is a plan view for the same purpose as FIG. 9;

FIG. 11 is a longitudinal-sectional side view for the same purpose as FIG. 9;

FIG. 15 is a front view illustrating another embodiment of the optical sensor according to the invention;

FIG. 16 is a plan view of the optical sensor shown in FIG. 15; and

FIG. 17 is a side view of the optical sensor shown in FIG. 16.

DESCRIPTION OF THE PREFERRED EMBODIMENTS

Figure 12:
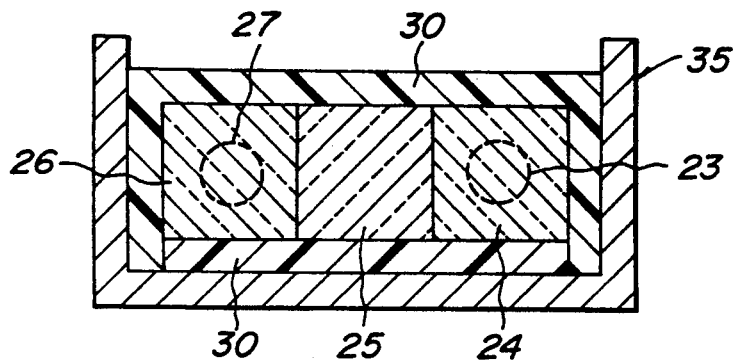
FIG. 12 is a cross-sectional front view for the same purpose as FIG. 9.

FIGS. 3, 4 and 5 illustrate an optical magnetic sensor as one embodiment of the optical sensor according to the invention in front, plan and side views. The optical magnetic sensor comprises an optical fiber 21, a ferrule 22, a lens 23, a polarizer 24, a Faraday element 25, an analyzer 26, a lens 27, a ferrule 28 and an optical fiber 29. Light beams from a light source (not shown) are caused to pass through these optical elements 21 to 29. A light receiver (not shown) receives the light beams emitted from the optical fiber 29 after passing through these optical elements. Magnetic fields acting upon the Faraday element 25 are optically measured on the basis of the modulation of the light beams received by the light receiver.

In this embodiment, the lens 23, the polarizer 24, the Faraday element 25, the analyzer 26 and the lens are brought into close contact with a synthetic resin 30 of epoxy or urethane type interposed between these optical elements without any clearances (gaps) therebetween. Moreover, a synthetic resin 30 of the same material as the first synthetic resin 30 is filled around these optical elements and the ferrules 22 and 28 including the optical fibers 21 and 29 without any clearances.

One embodiment of the method for producing the optical magnetic sensor shown in FIGS. 3 to 5 will be explained hereinafter.

FIG. 6 illustrates in a cross-sectional front view one example of a first base plate 31 for adjusting optical axes to be used in carrying out the method according to the invention. FIGS. 7 and 8 are plan and longitudinal sectional side views of the base plate shown in FIG. 6. The base plate 31 is integrally provided with a portion 32 for supporting the ferrule 22 and the lens 23, a portion 33 for supporting the lens 27 and ferrule 28, and a portion 34 for supporting the polarizer 24, the Faraday element 25 and the analyzer 26 so that the optical axes of these optical elements are properly aligned with each other only by they are arranged on these portions 32, 33 and 34, respectively. In the embodiment shown, the portions 32 and 33 are formed by V-shaped grooves. The base plate 31 is preferably made of a material, for example, Teflon (trade name) which is able to be easily separable from the optical elements after the synthetic resin 30 has solidified.

Figure 13:
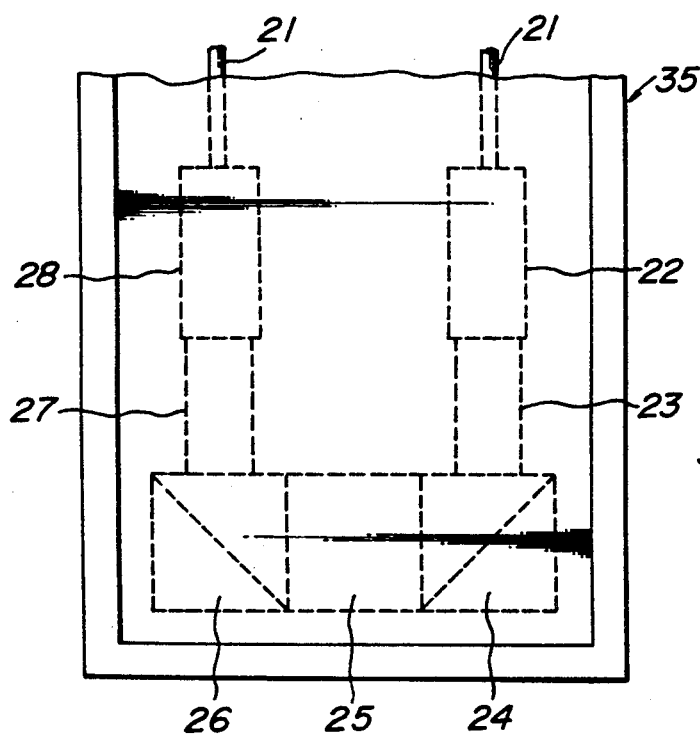
FIG. 13 is a plan view for the same purpose as FIG. 9.
Figure 14:
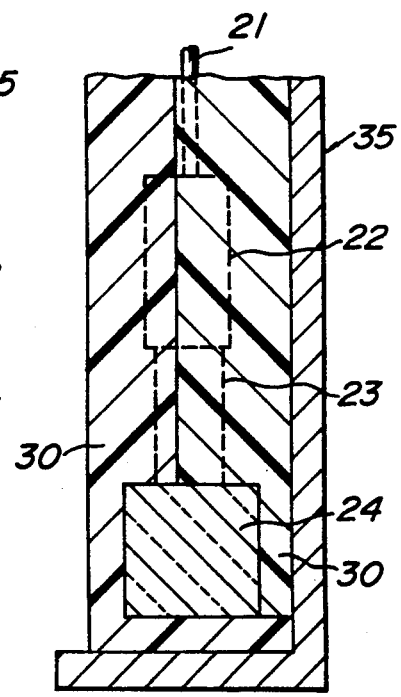
FIG. 14 is a longitudinal-sectional side view for the same purpose as FIG. 9.

As shown in FIGS. 9 to 11, the respective optical elements are arranged on the base plate 31 at their predetermined positions, respectively, so that they are in close contact with a synthetic resin 30 interposed therebetween without any clearances. Thereafter, a second synthetic resin 30 of the same material as the first synthetic resin 30 is filled around the optical elements in the base plate 31 and solidified (FIGS. 9 and 11). The optical elements and the second synthetic resin 30 as a unitary body are then removed from the base plate 31 and are turned upside down. As shown in FIGS. 12, 13 and 14, the unitary body is then arranged in a second base plate 35 which is made of a material similar to that of the first base plate 31 but has a flat bottom. A third synthetic resin 30 of the same material as the first synthetic resin 30 is then filled around the optical elements and the second synthetic resin 30 in the second base plate 35 and solidified. Thereafter, the optical elements and the second and third synthetic resins 30 are removed from the second base plate 35 to obtain the optical magnetic sensor shown in FIGS. 3 to 5.

FIGS. 15, 16 and 17 illustrate in front, plan and side views another embodiment of the optical sensor according to the invention. The optical sensor is similar to the optical sensor shown in FIGS. 3 to 5 with exception that a first base plate 31 is embedded together with optical elements in the second synthetic resin 30.

In this embodiment, a base plate 31 is made of a material, for example, alumina, zirconia or the like which is easily bonded to a synthetic resin 30. The respective optical elements are bonded onto the base plate 31 so that the optical elements are in close contact with a first synthetic resin 30 interposed between the optical elements without any clearances, and then a second synthetic resin 30 of the same material as the first synthetic resin 30 is filled in the base plate 31 and solidified. Thereafter, the optical elements together with the bas plate 31 are turned upside down and arranged on a second base plate 35 having a flat bottom plate. A third synthetic resin 30 of the same material as the first synthetic resin 30 is filled around the optical elements and the first base plate 31 in the second base plate 35 and solidified in the same manner as in the first embodiment. The optical elements and the base plate 31 are then removed from the second base plate 35 to obtain the optical sensor.

The invention is not limited to the optical magnetic sensors described above. For example, a Pockels element may be used instead of the Faraday element 25, and a quarter-wave plate may be interposed between the polarizer 24 and the Pockels element or between the Pockets element and the analyzer 26 to obtain an optical voltage sensor. Moreover, the invention is effectively applicable to other optical sensors.

As can be seen from the above description, according to the invention it is possible to prevent thermal stresses in the sensor due to difference in thermal expansion coefficients so that temperature characteristics of the optical sensor can be effectively improved. Moreover, by the prevention of the thermal stresses, the resins in the sensor are free from cracks, crevices and damage. Accordingly, the optical sensor according to the invention is superior in resistance to moisture, vibrations and shocks so that the reliability of the optical sensor is improved.

Moreover, the method according to the invention produces the optical sensor with a fewer number of parts and does so inexpensively with high mass-productivity.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A method for producing an optical sensor comprising a plurality of optical elements including one of a Faraday element and a Pockels element, whereby light is transmitted through said optical elements to optically measure one of an applied voltage, an electric field and a magnetic field acting upon said one of a Faraday element and a Pockels element, comprising steps of:
    arranging the optical elements on a first base plate for adjusting optical axes of the optical elements so that the optical elements are in close contact with a first synthetic resin interposed between adjacent optical elements;
    filling a second synthetic resin around the optical elements, the second synthetic resin being of the same material as said first synthetic resin;
    solidifying the second synthetic resin;
    removing from the bas plate the optical elements together with the second synthetic resin after solidification;
    turning the optical elements and the second synthetic resin upside down and arranging said optical elements and said second synthetic resin on a second base plate having a flat bottom surface;
    filling a third synthetic resin of the same material as the first synthetic resin around the optical elements;
    solidifying the third synthetic resin; and
    removing the optical elements together with the second and third synthetic resins from the second base plate.

2. The method of claim 1, wherein said first base plate is made of a material which allows easy separation of the base plate from the optical elements after the synthetic resin has been solidified.

3. The method of claim 1, wherein said first synthetic resin is selected from a group consisting of epoxy type and urethane type resins.

4. The method of claim 1, wherein said first base plate comprises a surface on which said optical elements are arranged, said surface including V-shaped grooves, further comprising the step of aligning the optical axes of the optical elements with one another by only arranging the optical elements on the surface.

5. A method for producing an optical sensor comprising a plurality of optical elements including one of a Faraday element and a Pockels element, whereby light is transmitted through the optical elements to optically measure one of an applied voltage, an electric field and a magnetic field acting upon said one of a Faraday element and a Pockels element, comprising steps of:
    bonding the optical elements onto a first base plate for adjusting optical axes of the optical elements, the optical elements being in close contact with a first synthetic resin interposed between adjacent optical elements;

filling a second synthetic resin around the optical elements, said second synthetic resin being of the same material as said first synthetic resin;

solidifying the filled second synthetic resin, said optical elements, said base plate and said second resin forming an intermediate structure;

turning the intermediate structure upside down and arranging the intermediate structure on a second base plate having a flat bottom surface;

filling a third synthetic resin of the same material as the first synthetic resin around the optical elements and the first base plate;

solidifying the third synthetic resin; and removing the optical elements together with the first base plate and the second and third synthetic resins form the second base plate.

6. The method of claim 5, wherein said first base plate is made of a material selected from a group consisting of alumina and zirconia.

7. An optical sensor, comprising:
a plurality of optical elements comprising one of a Pockels element and a Faraday element;
input means for transmitting light to said optical elements;
output means for transmitting light from said optical elements, whereby light passing through said optical elements is modulated to optically measure one of an applied voltage, an electric field and a magnetic field acting on said one of a Pockels element and a Faraday element;
a first synthetic resin interposed between adjacent optical elements such that said optical elements are in close contact with said first synthetic resin such that gaps present between adjacent optical elements are completely filled by said first synthetic resin; and
a second synthetic resin surrounding said optical elements, said second synthetic resin being made of the same material as said first synthetic resin.

8. The optical sensor of claim 7, further comprising a base upon which said optical elements are arranged.

9. The optical sensor of claim 8, wherein said second synthetic resin surrounds said base.

10. The optical sensor of claim 8, wherein said base comprises a surface upon which said optical elements are arranged, said surface comprising a V-shaped groove for properly aligning the optical axes of each of the optical elements with respect to each other.

11. The optical sensor of claim 8, wherein said base comprises a material from the group consisting of alumina and zirconia.

12. The optical sensor of claim 7, further comprising an analyzer and a polarizer optically aligned with said one of a Pockels elements and a Faraday element, said one of a Pockels element and a Faraday element being positioned between said polarizer and said analyzer.

13. The optical sensor of claim 7, wherein said optical elements further comprise a first lens for receiving light from said first input means, and a second lens for transmitting light to said output means.

14. The optical sensor of claim 7, wherein said first synthetic resin is selected from the group consisting of epoxy-type resin and urethane-type resin.

15. The optical sensor of claim 7, wherein said input means comprises a first optical fiber, and said output means comprises a second optical fiber.

* * * * *